United States Patent
Yeom et al.

(10) Patent No.: US 7,799,706 B2
(45) Date of Patent: Sep. 21, 2010

(54) NEUTRAL BEAM-ASSISTED ATOMIC LAYER CHEMICAL VAPOR DEPOSITION APPARATUS AND METHOD OF PROCESSING SUBSTRATE USING THE SAME

(75) Inventors: Geun-young Yeom, Seoul (KR); Byoung-jae Park, Gyeryong-si (KR); Sung-woo Kim, Seoul (KR); Jong-tae Lim, Seoul (KR)

(73) Assignee: Sungkyunkwan University Foundation for Corporate Collaboration, Gyeonggi-do (KR)

( * ) Notice: Subject to any disclaimer, the term of this patent is extended or adjusted under 35 U.S.C. 154(b) by 0 days.

(21) Appl. No.: 12/031,498

(22) Filed: Feb. 14, 2008

(65) Prior Publication Data

US 2009/0203226 A1 Aug. 13, 2009

(30) Foreign Application Priority Data

Feb. 11, 2008 (KR) .................. 10-2008-0012330

(51) Int. Cl.
*H01L 21/31* (2006.01)
*H01L 21/469* (2006.01)
(52) U.S. Cl. .................. 438/792; 438/438; 438/428; 257/E21.242; 257/E21.493
(58) Field of Classification Search .............. 438/792, 438/798, 436, 438, 428; 118/723 FI, 723 EB; 257/E21.241, E21.242, E21.243, E21.489, 257/E21.493 M, E21.494, E21.493
See application file for complete search history.

(56) References Cited

U.S. PATENT DOCUMENTS

| | | | | |
|---|---|---|---|---|
| 2001/0050144 A1* | 12/2001 | Nishikawa et al. | .......... | 156/345 |
| 2006/0213443 A1* | 9/2006 | Yeom et al. | ............ | 118/723 FI |
| 2006/0219887 A1* | 10/2006 | Hwang et al. | .............. | 250/251 |

* cited by examiner

*Primary Examiner*—Caridad M Everhart
(74) *Attorney, Agent, or Firm*—Harness, Dickey & Pierce, P.L.C.

(57) ABSTRACT

A neutral beam-assisted atomic layer chemical vapor deposition (ALCVD) apparatus is provided for uniformly depositing an oxide layer filling a planarization layer or a trench to increase uniformity and density of the oxide layer using neutral beams generated by a neutral beam generator without a seam or void occurring in an atomic layer deposition (ALD) or ALD-like chemical vapor deposition (CVD) process, thereby solving problems on the void or seam and low density occurring when a high-density planarization layer or a shallow trench having a width of 65 nm or less is formed, and improving a next generation oxide layer isolation process. The neutral beam-assisted ALCVD apparatus includes: an ALCVD apparatus, which deposits an oxide layer in order to form a pattern in a semiconductor substrate; and a neutral beam generator, which converts ion beams to neutral beams in order to remove a seam or void in the oxide layer deposited between the patterns, and applies the neutral beams to the oxide layer deposited to form the pattern.

4 Claims, 7 Drawing Sheets

NEUTRAL BEAM-ASSISTED ATOMIC LAYER CHEMICAL VAPOR DEPOSITION APPARATUS AND METHOD OF PROCESSING SUBSTRATE USING THE SAME

CROSS-REFERENCE TO RELATED APPLICATION

This application claims the benefit of Korean Patent Application No. 2008-0012330, filed Feb. 11, 2008, the disclosure of which is hereby incorporated herein by reference in its entirety.

BACKGROUND OF THE INVENTION

1. Field of the Invention

The present invention relates to a neutral beam-assisted atomic layer chemical vapor deposition (ALCVD) apparatus, and more particularly, to a neutral beam-assisted atomic layer chemical vapor deposition (ALCVD) apparatus and a method of processing a substrate using the same, capable of improving density of a planarization layer and preventing non-uniform deposition in the process of filling a gap or a shallow trench with an oxide layer by adding a neutral beam processing process.

2. Description of the Related Art

In general, chemical vapor deposition (CVD) is one of the industrial methods of forming a thin layer of, for instance, silicon on a substrate in the process of fabricating, for instance, an integrated circuit. In the CVD, when a gas including any chemical material is converted to plasma by heat, light or radio frequency energy, a raw material is converted to radicals, which are highly reactive, and is then adsorbed and deposited on a substrate.

Atomic layer deposition (ALD) refers to nanoscale thin layer deposition technology using a phenomenon of a monoatomic layer that is chemically bonded during semiconductor fabrication, and enables layer-by-layer deposition, in which a deposited layer has the thickness of an atomic layer, by alternation between adsorption and substitution of molecules on the surface of a wafer.

Furthermore, the ALD may make deposited oxide and metal thin layers thin to the maximum extent, and may form a layer at a lower temperature than the CVD in which particles formed by a chemical reaction of the gas are deposited on a wafer surface, so that it is suitable for system-on-chip fabrication.

Further, in the case of a dynamic random access memory (DRAM), a trench pattern is formed using the CVD or ALD. This trench pattern is used for high density of a semiconductor device, and serves as a capacitor by forming a deep groove in a silicon substrate and generating capacitance between both sidewalls of the groove.

FIG. 1 is a roadmap for the pitch width and the trench aspect ratio in a DRAM. According to International Technology Roadmap for Semiconductor (ITRS) for the DRAM as illustrated in FIG. 1, 65 nm devices are mass-produced on a production line as of 2007.

In consideration of this trend, 45 nm devices may be mass-produced in 2009, and 32 nm devices may be mass-produced after 2012. It may be said that two processes, which are definitely applied to design rules for next-generation devices and thus make the devices fine, are a process of forming a gate pattern and a process of forming a trench pattern for electrical insulation Here, the design rules specify that the upper width of a trench is sharply reduced, while the depth of a trench is not relatively reduced for stable insulation between the devices. Thus, the trench pattern shows a sharp increase in the aspect ratio (AR). The AR of the trench pattern may be supposed that at least 10 will be required after 2012.

When the trench pattern is formed, it is predicted that a silicon active pattern may be etched. However, this process has a difficulty in that, after the trench pattern is formed, a gap-fill process of filling the trench pattern with an oxide layer acts as a bottleneck.

FIG. 2 illustrates a trench depth and a gap-fill aspect ratio (AR) according to a technology node. As illustrated in FIG. 2, the upper width of a trench is considered for diversity within a wafer in the mass-production based on real process.

Since 45 nm class devices are based on a process for a large area of 300 mm, this diversity is expected to become stronger. The AR of the trench required for the trench gap-fill is about 10:1 or more. In the case of the CVD, high step coverage will be required.

Among the semiconductor processes, the deposition process associated with the gap-fill, such as a shallow trench isolation (STI) process, an interlevel dielectric (ILD) process, an inter metal dielectric (IMD) process, a pre metal dielectric (PMD) process, and a passivation process, has been performed using a high-density plasma chemical vapor deposition (HDPCVD) apparatus.

In contrast, in the case of 65 nm class devices, the gap-fill process using the HDPCVD apparatus encounters a limitation. As such, the deposition processes are carried out by other apparatuses using spin-on dielectric (SOD), sub-atmosphere chemical vapor deposition (SA-CVD), pulsed deposition layer (PDL) and so on. These apparatuses are also expensive, and thus have a difficulty in profile control, so that they have a problem in that a process capable of performing the gap-fill process in sub-65 nm class devices is required.

SUMMARY OF THE INVENTION

The present invention provides a neutral beam-assisted atomic layer chemical vapor deposition (ALCVD) apparatus and a method of processing a substrate using the same, which may be used for a gap-fill process of filling a planarization layer or a trench pattern with an oxide layer in a sub-65 nm device for a next generation semiconductor.

The present invention also provides a neutral beam-assisted atomic layer chemical vapor deposition (ALCVD) apparatus and a method of processing a substrate using the same, capable of forming a trench pattern such that no seam or void is formed in an oxide layer deposition process used for an isolation process such as a shallow trench isolation (STI) process or an interlevel dielectric (ILD) process.

The present invention also provides a neutral beam-assisted atomic layer chemical vapor deposition (ALCVD) apparatus and a method of processing a substrate using the same, capable of removing a low-density phenomenon occurring in an ALD or CVD process.

In other words, unlike the technology disclosed in US Patent Application No. 2006-0213443 (filed on Sep. 18, 2006) in which a first reaction gas is injected into an inlet of a reaction chamber, and reacts with a target substrate, and then a second reaction gas is injected into an inlet of an ion source, is processed with a neutral beam, and is applied into the target substrate, the present invention is to provide a neutral beam-assisted atomic layer chemical vapor deposition (ALCVD) apparatus and a method of processing a substrate using the same, in which an ALD process, a CVD process, or a combination thereof, i.e., an ALCVD process, is in progress, and simultaneously the neutral beams continue to process a deposited layer without any aid.

According to one aspect of the present invention, there is provided a neutral beam-assisted atomic layer chemical vapor deposition (ALCVD) apparatus, which includes: an ALCVD apparatus, which deposits an oxide layer in order to form a planarization layer or patterns in a semiconductor substrate; and a neutral beam generator, which converts ion beams to neutral beams in order to improve density of the planarization layer and remove a seam or void in the oxide layer deposited between the patterns, and applies the neutral beams to the oxide layer deposited to form the pattern, wherein the deposition of the oxide layer and the application of the neutral beams are performed at the same time.

Here, the pattern may be a trench pattern.

Further, the trench pattern may include a trench having a width of 65 nm or less.

Also, the trench may have an aspect ratio of 10:1 or more.

Meanwhile, the semiconductor substrate may be used for a dynamic random access memory (DRAM).

Further, the neutral beam generator may include: an ion source, which generates ion beams having a polarity from a gas for generating the ion beams when the gas is injected; a grid assembly, which is installed on one end of the ion source; a reflector, which is aligned with the grid assembly, and converts the ion beams to the neutral beams; and a stage, on which the substrate, i.e., wafer is placed on a traveling path of the neutral beams.

Further, the gas injected into the neutral beam generator may include one selected from the group consisting of inert gas series, nitrogen series, and oxygen series.

In addition, the semiconductor substrate may be formed of an oxide series which is used in a shallow trench isolation (STI) process, an interlevel dielectric (ILD) process, an inter metal dielectric (IMD) process, a pre metal dielectric (PMD) process, and a passivation process.

According to another aspect of the present invention, there is provided a method of processing a substrate using a neutral beam-assisted atomic layer chemical vapor deposition (AL-CVD) apparatus. The method includes: injecting a gas in order to generate ion beams; generating the ion beams having a polarity from the injected gas; converting the ion beams to neutral beams; and applying the neutral beams to an oxide layer in the substrate, wherein the oxide layer is deposited on a planarization layer or a trench pattern formed in the substrate, and the deposition of the oxide layer and the application of the neutral beams are performed at the same time.

BRIEF DESCRIPTION OF THE DRAWINGS

The above and other advantages of the present invention will become readily apparent by reference to the following detailed description when considered in conjunction with the accompanying drawings wherein.

DESCRIPTION OF THE EXEMPLARY EMBODIMENTS

The present invention may increase low oxide-layer uniformity, which is caused by formation of a seam or void, by applying neutral beams to an oxide layer using a neutral beam generator of an atomic layer chemical vapor deposition (AL-CVD) apparatus while depositing the oxide layer in order to form a trench pattern in a semiconductor device, and fill a spacing between cells at high density while reducing the spacing.

Hereinafter, the present invention will be explained in detail with reference to the accompanying drawings.

First, the configuration of a neutral beam-assisted ALCVD apparatus according to the present invention will be described with reference to the accompanying drawings.

Figure 1:
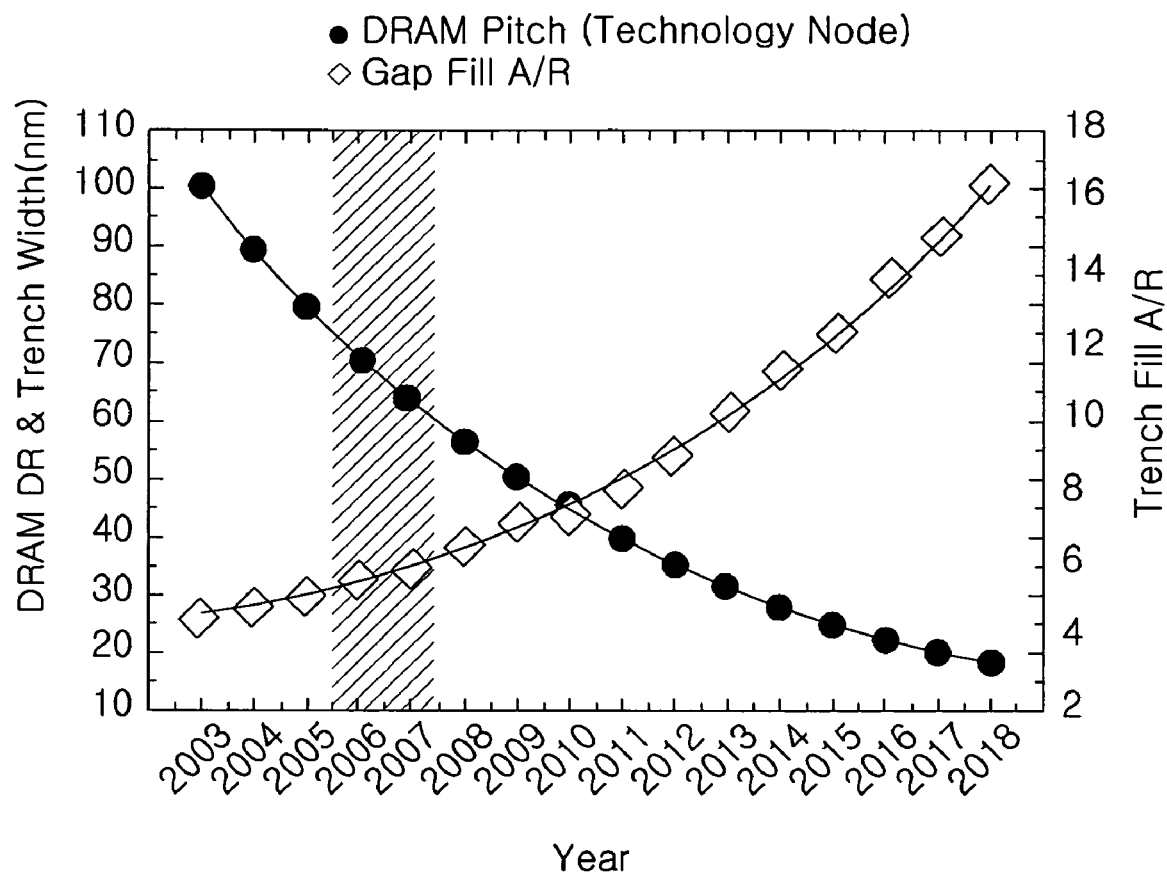
FIG. 1 is a roadmap for the pitch width and the trench aspect ratio in a dynamic random access memory (DRAM)
Figure 2:
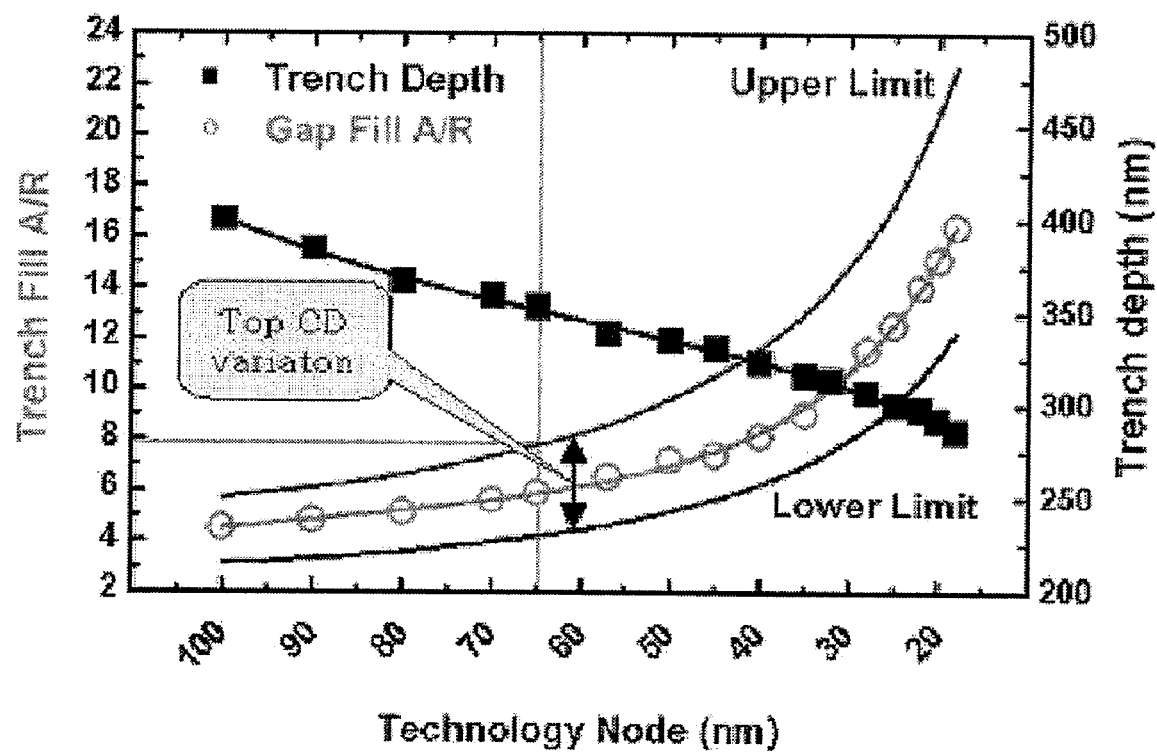
FIG. 2 illustrates a trench depth and a gap-fill aspect ratio according to a technology node.
Figure 3:
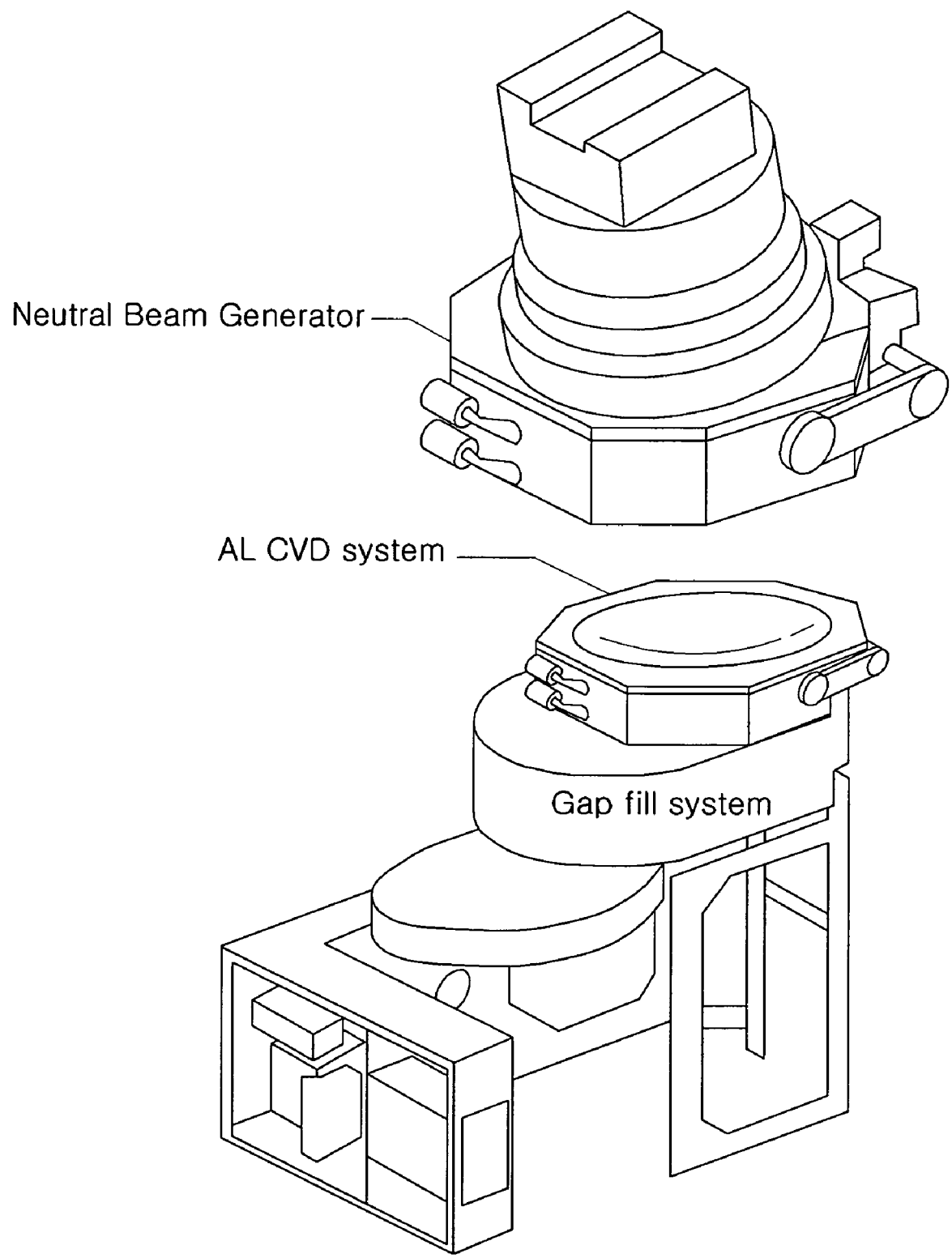
FIG. 3 is a schematic perspective view of a neutral beam-assisted atomic layer chemical vapor deposition (ALCVD) apparatus according to the present invention.
Figure 4:
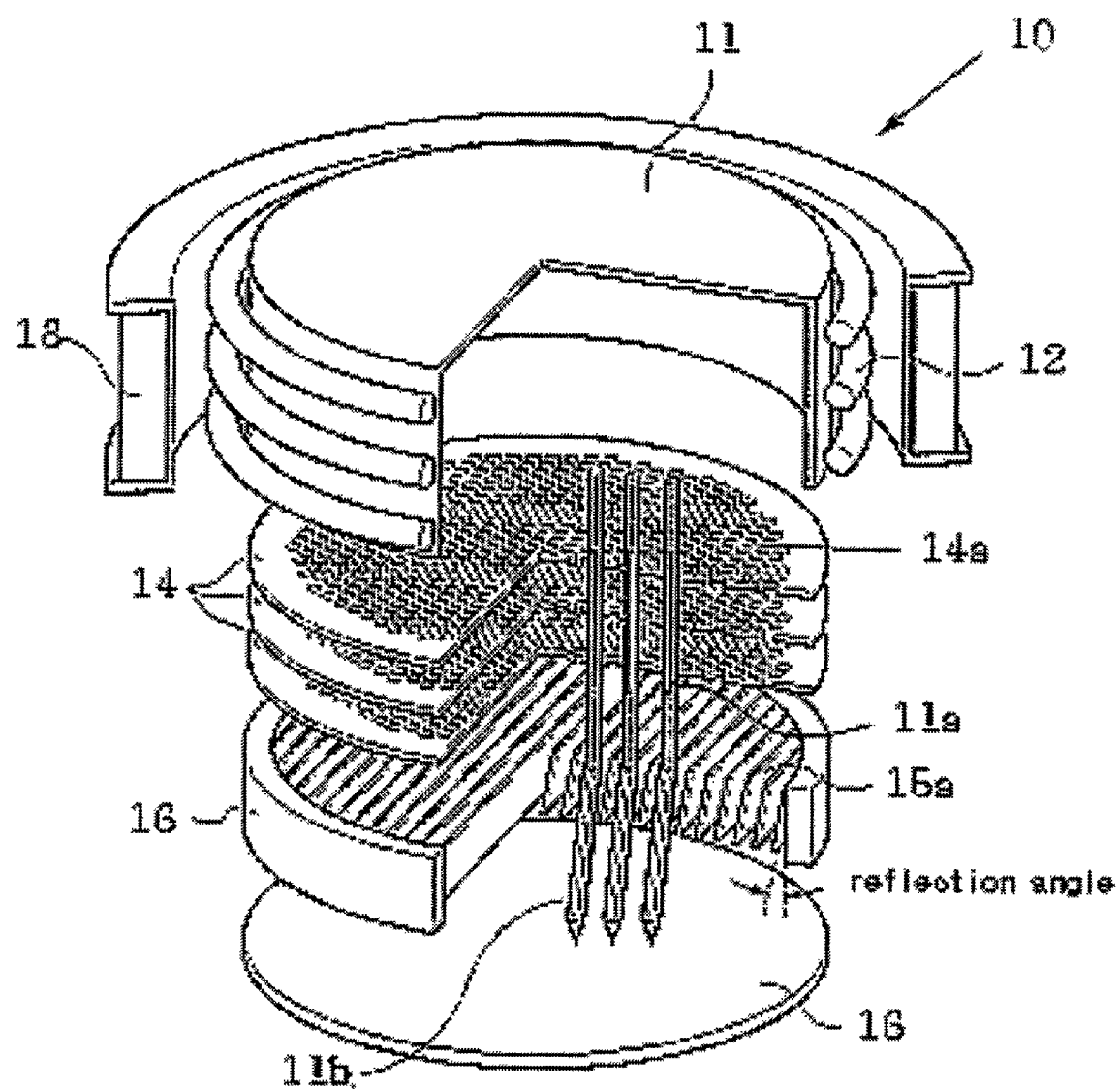
FIG. 4 is a schematic perspective view of a neutral beam generator in the neutral beam-assisted ALCVD apparatus illustrated in FIG. 3.

FIG. 3 is a schematic perspective view of a neutral beam-assisted ALCVD apparatus according to the present invention, and FIG. 4 is a schematic perspective view of a neutral beam generator in the neutral beam-assisted ALCVD apparatus illustrated in FIG. 3.

As illustrated, the neutral beam-assisted ALCVD apparatus includes a neutral beam generator 10 and an ALCVD apparatus.

Preferably, the neutral beam generator 10 is located on top of the ALCVD apparatus, and simultaneously processes an oxide layer formed on a target substrate 16 by the ALCVD apparatus.

As illustrated in FIG. 4, the neutral beam generator 10 includes an ion source 11, an induction coil 12, an electromagnet 13, a grid assembly 14, and a reflector 15.

Here, the ion source 11 may extract and accelerate ion beams 11a having a predetermined polarity. The induction coil 12 is wound around the ion source 11.

The electromagnet 13 applies an electromagnetic field to the induction coil 12. The grid assembly 14 is located under the ion source 11, and has three grids, each of which is provided with a plurality of grid holes 14a through which the ion beams 11a passes.

The reflector 15 is in close contact with the grid assembly 14, and has a plurality of reflecting plates 15a corresponding to the grid holes 14a of the grid assembly 14. The reflector 15 reflects the ion beams 11a, which pass through the grid holes 14a, onto the reflecting plates 15a, and converts the reflected ion beams to neutral beams 11b.

Further, the neutral beam generator 10 includes a stage, which may position the target substrate 16, the wafer, on a traveling path of the neutral beams 11b.

Preferably, a retarding grid is additionally installed between the reflector 15 and the stage to control directionality and accelerating energy of the neutral beams 11b. A diameter of the reflecting plate 15a may be constructed to be equal to or greater than a diameter of each grid hole 14a.

Further, the grid assembly 14 has a cylindrical shape, and is provided with protrusions along an outer circumferential edge of the bottom surface thereof. The reflector 15 has a cylindrical shape, and is provided with protrusions, which may be inserted into the respective protrusions of the grid assembly 14, along an outer circumferential edge of the top surface thereof.

Furthermore, the reflecting plates 15a are inclined to a direction of the ion beams 11a at a predetermined angle such that the ion beams 11a traveling straight through the grid holes 14a are reflected from the reflecting plates 15a.

Here, the reflecting plates 15a of the reflector 15 may be arranged to be inclined to the central axis of the reflector 15 at a predetermined angle or to be parallel to the central axis of the reflector 15. The protrusions of the reflector 15, which are formed along the outer circumferential edge of the top surface of the reflector 15, may be inclined at a predetermined angle.

According to the present invention, the ion source 11 may include various types of ion sources. The reflector 15 may be formed of a semiconductor substrate, a silicon dioxide or metal substrate, or a graphite substrate. Each ion beam 11a, which is incident through the grid holes 14a of the grid assembly 14, may be constructed to have an incident angle from 5 to 15 degrees.

In the present invention, the ion source 11 may generate the ion beams 11a, and the reflector 15 may be installed between the ion source 11 and the stage on which the target substrate 16, the wafer, is placed, to reflect the ion beams 11a having a predetermined incident angle. Thereby, the neutral beams 11b may be obtained.

Thus, the target substrate 16, the wafer, is processed with a shallow trench oxide layer, so that the density of a shallow trench oxide layer having a high aspect ratio, which cannot be obtained by existing ion beam or plasma processing, can be improved, and that the seam or void can be eliminated.

In order words, the neutral beam generator 10 includes a plasma generating chamber, three grids that sequentially overlap each other, and a reflector. Here, the ion beams are accelerated by applying a positive voltage to the first grid, the uppermost grid, of the three grids, which is adjacent to the plasma generating chamber, and an optical axis of each beam is adjusted by applying a negative voltage to the second grid, the intermediate grid.

Further, the third grid, the lowermost grid and the reflector are grounded to convert the extracted ion beams to the neutral beams.

The neutral beam-assisted ALCVD apparatus of the present invention may employ various kinds of gases, e.g., inert gas series such as argon, nitrogen series, oxygen series, and so on. The target substrate 16 is processed by a deposition process associated with the gap-fill of the semiconductor processes.

Here, when the planarization layer or trench gap-fill process is performed using a shallow trench isolation (STI) process, an interlevel dielectric (ILD) process, an inter metal dielectric (IMD) process, a pre metal dielectric (PMD) process, or a passivation process, the target substrate 16 has a high aspect ratio, and requires high step coverage. For this, the substrate 16 makes use of oxide layer series such as silica ($SiO_2$).

According to the present invention, the grid assembly 14 and the reflector 15, which are located under the ion source 11, are in close contact with each other, so that the ion beams 11a can be prevented from being leaked in an undesired direction, thus remarkably reducing contamination. Thereby, neutron flux, which refers to the number of neutrons passing through a unit area of the neutral beams 11b in unit time, may be considerably increased.

Further, since the increase in the neutron flux of the neutral beams 11b may reduce a space occupied by the reflector 15, the neutral beam-assisted ALCVD apparatus may be made small and inexpensive.

The ion beams 11a may be accelerated by voltage application. The grid assembly 14 having the plurality of grid holes 14a through which the ion beams 11 can pass is disclosed in Korean Patent No. 0380600, granted to the present applicant, and so the description thereof will be omitted.

Here, a process of driving the neutral beam-assisted ALCVD apparatus will be described.

First, an ALD process, a CVD process or a combination thereof, i.e., an ALCVD process, is performed in order to fill a planarization layer or a trench pattern with an oxide layer.

At this time, neutral beams are generated in the following manner, and continue to assist the process while the process is performed.

Next, in order to generate the ion beams 11a, an ion gas is injected through an ion beam generating gas inlet (not shown).

Then, the ion gas, which is injected through the ion beam generating gas inlet, is generated to the ion beams 11a having a polarity by the ion source 11. The generated ion beams 11 pass through the grid assembly 14 and the reflector 15, and then are converted to the neutral beams 11b.

The neutral beams 11b are applied to the target substrate 16, the wafer, such that uniformity of an oxide layer is not reduced due to a void or seam. Thereby, the oxide layer is deposited on a trench of the wafer so as to have high uniformity.

Figure 5:
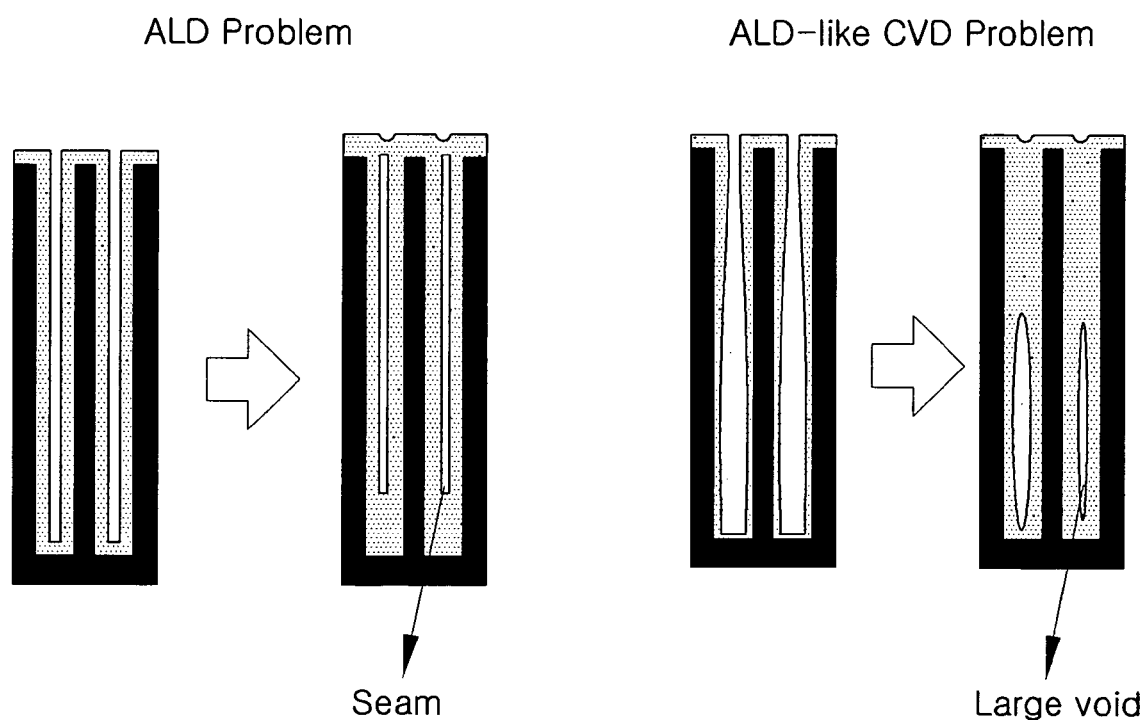
FIG. 5 is a schematic view showing problems associated with conventional atomic layer deposition (ALD) and ALD-like CVD.

FIG. 5 is a schematic view showing problems associated with conventional atomic layer deposition (ALD) and ALD-like CVD. As shown in FIG. 5, the ALD is known that it has not been easily applied to the gap-fill process of a sub-65 nm shallow trench.

The reason is as follows. As the process is in progress, the aspect ratio is gradually increased. As a result, the seam is generated, or the oxide layer is not filled in a wide gap. Particularly, the deposited oxide layer has low density.

Further, in the case of the ALD-like CVD, when the oxide layer is deposited in a shallow trench having a high aspect ratio of, for instance, 10:1, an upper portion of the trench is deposited at a speed faster than a lower portion of the trench, so that a cavity or void, in which the lower portion of the trench is not filled with the oxide layer, is formed.

Figure 6:
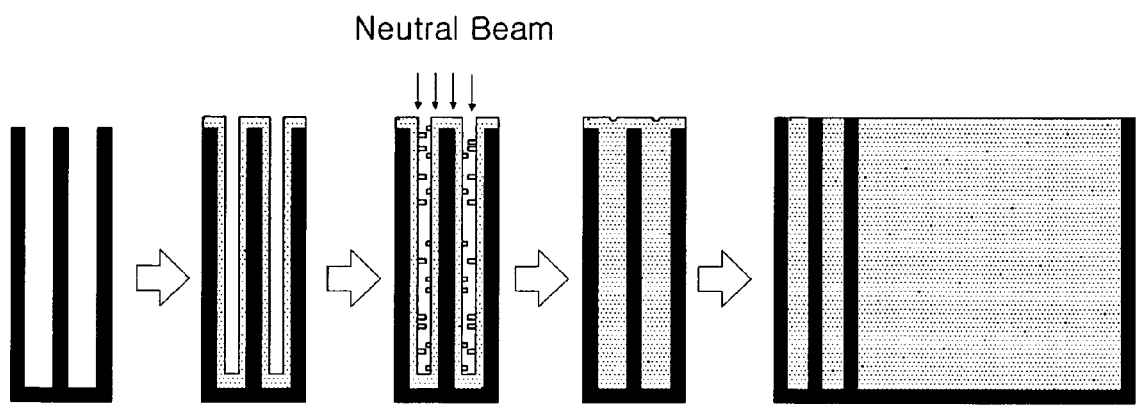
FIG. 6 illustrates how problems on a seam or a low-density thin layer occurring in an ALD process are solved by a neutral beam-assisted ALCVD apparatus according to the present invention.

FIG. 6 illustrates how problems on a seam or a low-density thin layer occurring in an ALD process are solved by a neutral beam-assisted ALCVD apparatus according to the present invention. As illustrated in FIG. 6, since the neutral beams are electrically neutral, the shallow trench having a high aspect ratio may be sequentially processed from the lower portion thereof, unlike the ion beam processing or the plasma processing.

Figure 7:
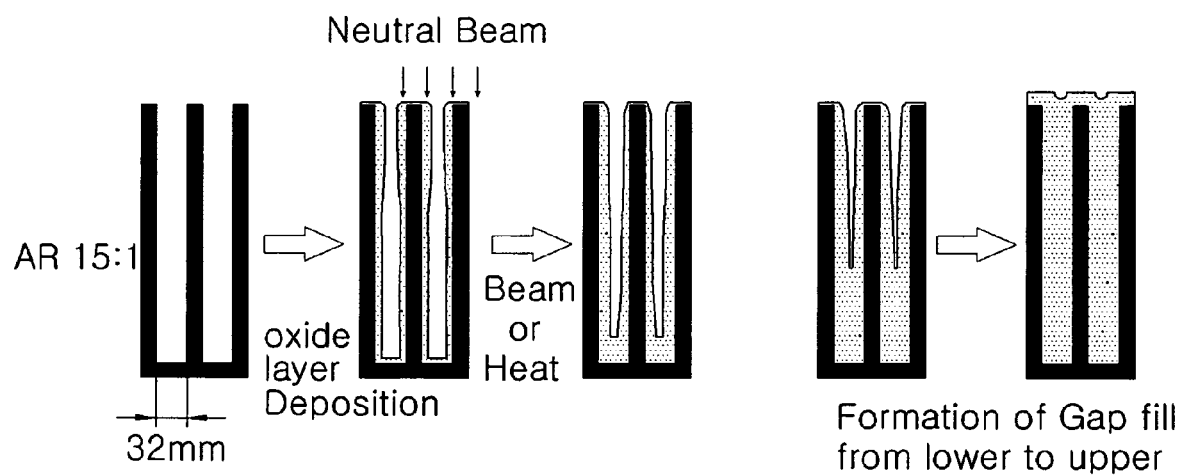
FIG. 7 illustrates how problems on a void or a low-density thin layer occurring in an ALD-like CVD process are solved by a neutral beam-assisted ALCVD apparatus according to the present invention.

FIG. 7 illustrates how problems on a void or a low-density thin layer occurring in an ALD-like CVD process are solved by a neutral beam-assisted ALCVD apparatus according to the present invention. As illustrated in FIG. 7, since the neutral beams are electrically neutral, the shallow trench having a high aspect ratio may be prevented from being blocked at the upper portion thereof.

As can be seen from the foregoing, the shallow trench is processed with the neutral beams such that the oxide layer can be deposited from the lower portion of the trench. Thereby, the void can be prevented, and simultaneously the density of the oxide layer can be increased. These features are also attributable to the characteristics of the neutral beams that are electrically neutral.

Thus, the neutral beam-assisted ALCVD apparatus according to the present invention can be applied to the substrate having a trench pattern that has an aspect ratio of 10:1 or more and a width of 65 nm or less. For example, the present invention can be applied to a trench pattern that has an aspect ratio from 10:1 to 15:1 and a width from 65 nm to 32 nm.

As described above, the present invention having the aforementioned configuration can solve the problem on the void or seam occurring in the gap-fill process of the trench pattern of the semiconductor substrate, deposit the oxide layer on the semiconductor substrate, the wafer, with high uniformity by applying the neutral beams to the oxide layer, and carry out the process of maintaining the insulation characteristics resulting from the isolation between internal cells of the device and reducing the width of the trench abreast with high integration and miniaturization of the semiconductor device.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. A method of processing a substrate using a neutral beam-assisted atomic layer chemical vapor deposition (ALCVD) apparatus, the method comprising:
    injecting a gas in order to generate ion beams;
    generating the ion beams having a polarity from the injected gas;
    converting the ion beams to neutral beams; and
    applying the neutral beams to an oxide layer in the substrate,
    wherein the oxide layer is deposited on trench pattern formed in the substrate, and the deposition of the oxide layer and the application of the neutral beams are performed at the same time or alternately.

2. The method of claim 1, wherein the trench pattern includes a trench having a width of 65 nm or less.

3. The method of claim 2, wherein the trench has an aspect ratio of 10:1 or more.

4. The method of claim 3, wherein the semiconductor substrate is used for a dynamic random access memory (DRAM).

* * * * *